(12) United States Patent
Lehtola

(10) Patent No.: US 9,602,056 B2
(45) Date of Patent: Mar. 21, 2017

(54) AMPLIFIER WITH BASE CURRENT REUSE

(71) Applicant: Skyworks Solutions, Inc., Irvine, CA (US)

(72) Inventor: Philip John Lehtola, Cedar Rapids, IA (US)

(73) Assignee: SKYWORKS SOLUTIONS, INC., Woburn, MA (US)

( * ) Notice: Subject to any disclaimer, the term of this patent is extended or adjusted under 35 U.S.C. 154(b) by 0 days.

(21) Appl. No.: 14/855,058

(22) Filed: Sep. 15, 2015

(65) Prior Publication Data

US 2016/0087589 A1    Mar. 24, 2016

Related U.S. Application Data

(60) Provisional application No. 62/052,956, filed on Sep. 19, 2014.

(51) Int. Cl.
| | |
|---|---|
| H03G 3/20 | (2006.01) |
| H03F 3/04 | (2006.01) |
| H03F 1/02 | (2006.01) |
| H03F 1/30 | (2006.01) |
| H03F 3/191 | (2006.01) |
| H03F 3/24 | (2006.01) |

(Continued)

(52) U.S. Cl.
CPC ......... *H03F 1/0211* (2013.01); *H03F 1/0283* (2013.01); *H03F 1/302* (2013.01); *H03F 3/19* (2013.01); *H03F 3/191* (2013.01); *H03F 3/211* (2013.01); *H03F 3/245* (2013.01); *H03F 2200/102* (2013.01); *H03F 2200/18* (2013.01); *H03F 2200/24* (2013.01); *H03F 2200/321* (2013.01); *H03F 2200/411* (2013.01); *H03F 2200/451* (2013.01); *H03F 2200/516* (2013.01); *H03F 2203/21127* (2013.01)

(58) Field of Classification Search
CPC .................................. H03G 3/20; H03F 3/04
USPC .......................................... 330/136, 127, 310
See application file for complete search history.

(56) References Cited

U.S. PATENT DOCUMENTS

| | | |
|---|---|---|
| 5,264,752 A | 11/1993 | Savicki |
| 7,482,869 B2 | 1/2009 | Wilson |
| 2002/0030543 A1 | 3/2002 | French et al. |

(Continued)

FOREIGN PATENT DOCUMENTS

| | | |
|---|---|---|
| GB | 2398648 | 8/2004 |
| GB | 2409115 | 11/2006 |

(Continued)

OTHER PUBLICATIONS

Blanken et al. "A 50MHz Bandwidth Multi-Mode PA Supply Modulator for GSM, EDGE and UMTS Application," IEEE Radio Frequency Integrated Circuits Symposium, Apr. 2008, pp. 401-404.

(Continued)

*Primary Examiner* — Patricia T Nguyen
(74) *Attorney, Agent, or Firm* — Knobbe, Martens, Olson & Bear LLP

(57) ABSTRACT

An RF amplifier module that has a plurality of amplifiers wherein at least one of the amplifiers is powered via an envelope tracking module. The biasing input of at least one of the amplifiers is provided to the first amplifier to power the first amplifier to reduce power consumption. The first amplifier may also be powered via fixed biasing to provide greater stability of the module.

20 Claims, 5 Drawing Sheets

(51) Int. Cl.
H03F 3/19 (2006.01)
H03F 3/21 (2006.01)

(56) References Cited

U.S. PATENT DOCUMENTS

| | | | |
|---|---|---|---|
| 2003/0155978 A1* | 8/2003 | Pehlke | H03F 1/025 330/296 |
| 2005/0064830 A1 | 3/2005 | Grigore | |
| 2006/0014509 A1* | 1/2006 | Xu | H03D 7/1441 455/255 |
| 2007/0210771 A1 | 9/2007 | Wilson et al. | |
| 2007/0249304 A1 | 10/2007 | Snelgrove et al. | |
| 2007/0273449 A1 | 11/2007 | Wilson | |
| 2007/0279019 A1 | 12/2007 | Wilson | |
| 2009/0128236 A1 | 5/2009 | Wilson | |
| 2009/0289720 A1* | 11/2009 | Takinami | G05F 1/565 330/297 |
| 2009/0302941 A1* | 12/2009 | Wimpenny | H03F 1/0227 330/199 |
| 2012/0139641 A1* | 6/2012 | Kaczman | H03F 1/0222 330/295 |
| 2012/0146731 A1 | 6/2012 | Khesbak | |
| 2012/0200354 A1 | 8/2012 | Ripley et al. | |
| 2013/0116017 A1* | 5/2013 | Zhang | H04B 1/0458 455/575.7 |
| 2013/0217345 A1 | 8/2013 | Balteanu et al. | |
| 2014/0167860 A1* | 6/2014 | Dhanasekaran | H03F 1/0227 330/296 |
| 2015/0009980 A1* | 1/2015 | Modi | H03F 3/245 370/338 |
| 2015/0105033 A1 | 4/2015 | Modi et al. | |

FOREIGN PATENT DOCUMENTS

| | | |
|---|---|---|
| GB | 2426392 | 5/2007 |
| GB | 2411062 | 11/2007 |
| WO | WO 2009/106628 | 9/2009 |
| WO | WO 2009/106631 | 9/2009 |
| WO | WO 2009/106632 | 9/2009 |
| WO | WO 2009/127739 | 10/2009 |
| WO | WO 2009/135941 | 11/2009 |
| WO | WO 2009/138505 | 11/2009 |
| WO | WO 2009/141413 | 11/2009 |

OTHER PUBLICATIONS

Huang et al. "A MASH Controlled Multilevel Power Converter for High-Efficiency RF Transmitters," IEEE Transactions on Power Electronics, vol. 26, No. 4, Apr. 2011, pp. 1205-1214.

Kaneta et al. "Architecture of Wideband High-Efficiency Envelope Tracking Power Amplifier for Base Station," IEICE Technical Report, Osaka, 2009.

Kang et al. "A Multimode/Multiband Power Amplifier With a Boosted Supply Modulator," IEEE Transactions on Microwave Theory and Techniques, vol. 58, No. 10, Oct. 2010, pp. 2598-2608.

Rodriguez et al. "A Multiple-Input Digitally Controlled Buck Converter for Envelope Tracking Applications in Radiofrequency Power Amplifiers," IEEE Transactions on Power Electronics, vol. 25, No. 2, Feb. 2010, pp. 369-381.

Wu et al. "A Two-Phase Switching Hybrid Supply Modulator for Polar Transmitters with 9% Efficiency Improvement," IEEE International Solid-State Circuits Conference, Feb. 2010, pp. 196-198.

Yousefzadeh et al. "Three-Level Buck Converter for Envelope Tracking Applications," IEEE Transactions on Power Electronics, vol. 21, No. 2, Mar. 2006, pp. 549-552.

* cited by examiner

AMPLIFIER WITH BASE CURRENT REUSE

BACKGROUND

Field of the Invention

Embodiments of the invention relate to electronic systems and, in particular, to radio frequency (RF) electronics.

Description of the Related Art

RF power amplifier can be used to boost the power of an RF signal having a relatively low power. Thereafter, the boosted RF signal can be used for a variety of purposes, including driving the antenna of a transmitter or receiving a transmitted signal received by the antenna.

Power amplifiers can be included in mobile phones or other mobile devices to amplify an RF signal for transmission or for reception. For example, in mobile phones that communicate using a wireless local area network (WLAN) protocol and/or any other suitable communication standard, one or more power amplifiers can be used to amplify the RF signal. However, the use of power amplifiers requires that use of current from the battery and can shorten available battery life of the mobile phone. It is important to manage the operation of the amplifiers to improve the battery life of the mobile device.

There is a need for improved power amplifier systems. Furthermore there is a need for improving the amplifiers and amplifier systems to reduce current consumption by these devices and systems.

SUMMARY

In one implementation, the aforementioned needs are addressed by an embodiment of a power amplifier module for a RF communications circuit, the module comprising: a driver stage amplifier having an input that receives an RF signal that is supplied by a supply voltage that is applied across the driver stage amplifier to amplify the RF signal; a final stage amplifier that receives an amplified RF signal from an output of the driver stage amplifier, that is powered by a supply voltage that is applied across the final stage amplifier, and that provides an amplified output signal, a bias current being applied to the input of the final stage amplifier and the bias current also being applied to power the driver stage amplifier to thereby reduce the current that flows through the driver stage amplifier; and an envelope tracking module that provides power to at least one of the driver stage amplifier and final stage amplifier.

In some embodiments of this implementation, the envelope tracking module provides power to the final stage amplifier.

In some embodiments of this implementation, the driver stage amplifier is powered from a fixed power source.

In some embodiments of this implementation, the fixed power source includes a battery.

In some embodiments of this implementation, the envelope tracking module provides power to both the driver stage amplifier and the final stage amplifier.

In some embodiments of this implementation, the driver stage amplifier includes a first transistor, the final stage amplifier includes a second transistor, a base of the first transistor forms the input of the driver stage amplifier, a collector of the first transistor forms the output of the driver stage amplifier and is connected to a base of the second transistor which forms the input of the final stage amplifier, and a collector of the second transistor forms the output of the final stage amplifier.

In some embodiments of this implementation, the base of the second transistor is biased by a current and is electrically connected to an emitter of the driver stage amplifier.

In some embodiments of this implementation, re-using the base current biasing of the final stage amplifier to power the input stage amplifier results in at an approximate efficiency improvement of 3% power added efficiency.

In another implementation, the aforementioned needs are addressed by an embodiment of an RF communications device comprising: an RF input that receives RF input signals; an RF output that receives RF signals; a dual stage power module having a first and second amplifiers, the input of the first amplifier receiving the RF signals from the RF input and the output of the first amplifier is provided to the input of the second amplifier which also receives a bias signal and the output of the second amplifier is provided to the output; a power supply that provides power to both the first and second amplifiers and at least one of the first and second amplifiers is provided power based on envelope tracking of the input signal; and an interconnect that interconnects the input of the second amplifier to the power supply of the first amplifier so that the bias signal is provided to the power supply of the first amplifier to provide power to the first amplifier.

In some embodiments of this implementation, the envelope tracking module provides power to the second amplifier.

In some embodiments of this implementation, the first amplifier is powered from a fixed power source.

In some embodiments of this implementation, the fixed power source includes a battery.

In some embodiments of this implementation, the envelope tracking module provides power to both the first amplifier and the second amplifier.

In some embodiments of this implementation, the first amplifier includes a first transistor, the second amplifier includes a second transistor, a base of the first transistor forms the input of the first amplifier, a collector of the first transistor forms the output of the first amplifier and is connected to a base of the second amplifier which forms the input of the second amplifier, and a collector of the second transistor forms the output of the second amplifier.

In some embodiments of this implementation, the base of the second transistor is biased by a current and is electrically connected to an emitter of the first amplifier.

In some embodiments of this implementation, there is a switching network that switches between a transmit and a receive mode.

In some embodiments of this implementation, there is a processor and computer readable medium that controls the envelope tracking module and the switching network.

In another implementation, the aforementioned needs are addressed by an embodiment of a method of amplifying RF signals, the method comprising: amplifying a first signal in a first amplifier; providing the output of the first amplifier to a second amplifier; providing power to the first and second amplifiers; biasing the input of the second amplifier with a biasing signal; and providing at least a portion of the biasing signal applied to the second amplifier to the first amplifier to power the first amplifier.

In some embodiments of this implementation, powering the first and second amplifiers includes detecting the envelop of the first signal and providing variable power to at least one of the first and second amplifiers based at least in part on the envelope of the first signal.

In some embodiments of this implementation, providing variable power to at least one of the first and second amplifiers includes providing variable power the second amplifier and providing fixed power to the first amplifier.

DETAILED DESCRIPTION OF THE PREFERRED EMBODIMENT

Figure 1:
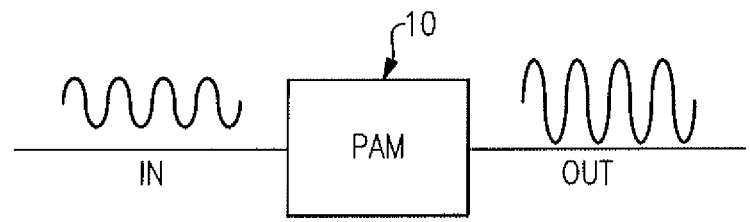
FIG. 1 is a schematic diagram of a power amplifier module for amplifying a radio frequency (RF) signal.

FIG. 1 is a schematic diagram of a power amplifier module 10 for amplifying a radio frequency (RF) signal. The illustrated power amplifier module (PAM) 10 can be configured to amplify an RF signal RF_IN to generate an amplified RF signal RF_OUT. As described herein, the power amplifier module 10 can include one or more power amplifiers, including, for example, multi-stage power amplifier having two or more amplifiers.

Figure 2:
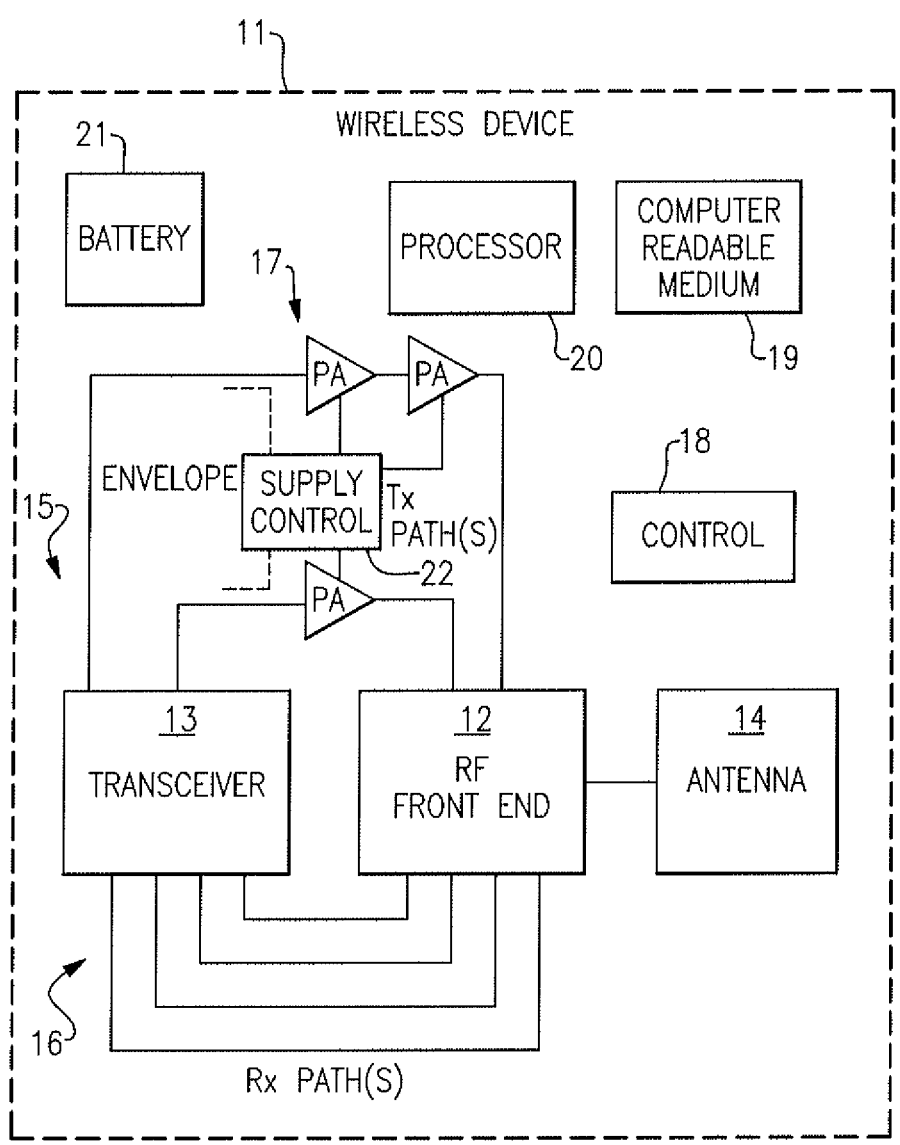
FIG. 2 is a schematic block diagram of an example wireless device that can include one or more of the power amplifier modules of FIG. 1.

FIG. 2 is a schematic block diagram of an example wireless or mobile device 11 that can include one or more of the power amplifier modules of FIG. 1. The wireless device 11 can include power amplifier bias circuits implementing one or more features of the present disclosure.

The example wireless device 11 depicted in FIG. 2 can represent a multi-band and/or multi-mode device such as a multi-band/multi-mode mobile phone. In certain embodiments, the wireless device 11 can include switches 12, a transceiver 13, an antenna 14, power amplifiers 17, a control component 18, a computer readable medium 19, a processor 20, and a battery 21.

The transceiver 13 can generate RF signals for transmission via the antenna 14. Furthermore, the transceiver 13 can receive incoming RF signals from the antenna 14.

It will be understood that various functionalities associated with the transmission and receiving of RF signals can be achieved by one or more components that are collectively represented in FIG. 2 as the transceiver 13. For example, a single component can be configured to provide both transmitting and receiving functionalities. In another example, transmitting and receiving functionalities can be provided by separate components.

Similarly, it will be understood that various antenna functionalities associated with the transmission and receiving of RF signals can be achieved by one or more components that are collectively represented in FIG. 2 as the antenna 14. For example, a single antenna can be configured to provide both transmitting and receiving functionalities. In another example, transmitting and receiving functionalities can be provided by separate antennas. In yet another example, different bands associated with the wireless device 11 can be provided with different antennas.

In FIG. 2, one or more output signals from the transceiver 13 are depicted as being provided to the antenna 14 via one or more transmission paths 15. In the example shown, different transmission paths 15 can represent output paths associated with different bands and/or different power outputs. For instance, the two example power amplifiers 17 shown can represent amplifications associated with different power output configurations (e.g., low power output and high power output), and/or amplifications associated with different bands. Although FIG. 2 illustrates a configuration using two transmission paths 15, the wireless device 11 can be adapted to include more or fewer transmission paths 15.

The power amplifiers 17 can be used to amplify a wide variety of RF signals. For example, one or more of the power amplifiers 17 can receive an enable signal that can be used to pulse the output of the power amplifier to aid in transmitting a wireless local area network (WLAN) signal or any other suitable pulsed signal. Each of the power amplifiers 17 need not amplify the same type of signal. For example, one power amplifier can amplify a WLAN signal, while another power amplifier can amplify, for example, a Global System for Mobile (GSM) signal, a code division multiple access (CDMA) signal, a W-CDMA signal, a Long Term Evolution (LTE) signal, or an EDGE signal.

One or more features of the present disclosure can be implemented in the foregoing example modes and/or bands, and in other communication standards.

In FIG. 2, one or more detected signals from the antenna 14 are depicted as being provided to the transceiver 13 via one or more receiving paths 16. In the example shown, different receiving paths 16 can represent paths associated with different bands. Although FIG. 2 illustrates a configuration using four receiving paths 16, the wireless device 11 can be adapted to include more or fewer receiving paths 16.

To facilitate switching between receive and transmit paths, the switches 12 can be configured to electrically connect the antenna 14 to a selected transmit or receive path. Thus, the switches 12 can provide a number of switching functionalities associated with an operation of the wireless device 11. In certain embodiments, the switches 12 can include a number of switches configured to provide functionalities associated with, for example, switching between different bands, switching between different power modes, switching between transmission and receiving modes, or some combination thereof. The switches 12 can also be configured to provide additional functionality, including filtering and/or duplexing of signals.

FIG. 2 shows that in certain embodiments, a control component 18 can be provided for controlling various control functionalities associated with operations of the switches 12, the power amplifiers 17, and/or other operating component(s). Non-limiting examples of the control component 18 are described herein in greater detail.

In certain embodiments, a processor 20 can be configured to facilitate implementation of various processes described herein. For the purpose of description, embodiments of the present disclosure may also be described with reference to flowchart illustrations and/or block diagrams of methods, apparatus (systems) and computer program products. It will be understood that each block of the flowchart illustrations and/or block diagrams, and combinations of blocks in the flowchart illustrations and/or block diagrams, may be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the acts specified in the flowchart and/or block diagram block or blocks.

In certain embodiments, these computer program instructions may also be stored in a computer-readable memory 19 that can direct a computer or other programmable data processing apparatus to operate in a particular manner, such that the instructions stored in the computer-readable memory produce an article of manufacture including instruction means which implement the acts specified in the flowchart and/or block diagram block or blocks. The computer program instructions may also be loaded onto a computer or other programmable data processing apparatus to cause a series of operations to be performed on the computer or other programmable apparatus to produce a computer implemented process such that the instructions that execute on the computer or other programmable apparatus provide steps for implementing the acts specified in the flowchart and/or block diagram block or blocks.

The battery 21 can be any suitable battery for use in the wireless device 11, including, for example, a lithium-ion battery.

The illustrated wireless device 11 also includes the supply control block 22, which can be used to provide a power supply to one or more of the power amplifiers 17. For example, the supply control block 22 can be an envelope tracker configured to change or vary the supply voltage provided to the power amplifiers 17 based upon an envelope of the RF signal to be amplified. However, in certain embodiments the supply control block 22 can be other blocks, including, for example, a DC-to-DC converter. As will be discussed in greater detail below, the supply control block 22 can be used to control not just single stage amplifiers but also dual stage amplifiers as shown in FIG. 2.

The supply control block 22 can be electrically connected to the battery 21, and the supply control block 22 can be configured to change the voltage provided to the power amplifiers 17 based on an envelope of the RF signal to be amplified. The battery 21 can be any suitable battery for use in the wireless device 11, including, for example, a lithium-ion battery. As will be described in detail further below, by controlling the voltage provided to the power amplifiers, the power consumption of the battery 21 can be reduced, thereby improving performance of the wireless device 11. As illustrated in FIG. 2, the envelope signal can be provided to the supply control block 22 from the transceiver 13. However, the envelope can be determined in other ways. For example, the envelope can be determined by detecting the envelope from the RF signal using any suitable envelope detector.

Figure 3:
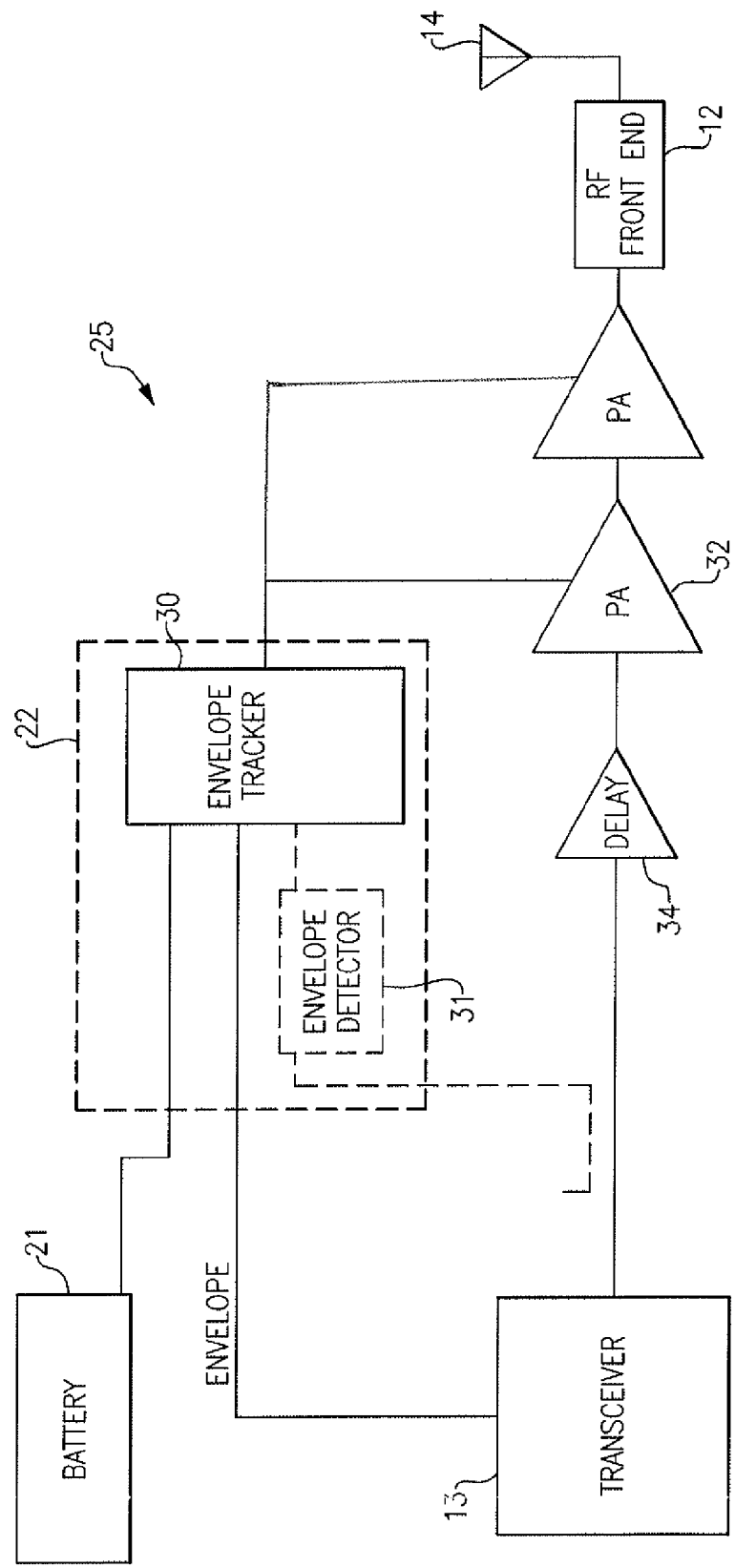
FIG. 3 is a schematic block diagram of one example of an amplifier component having an envelope tracking capability.

FIG. 3 is a schematic block diagram of one example of a power amplifier system 25 having an envelope tracker 30. The illustrated system includes the RF front end 12, the transceiver 13, the antenna 14, the battery 21, a delay element 34, a power amplifier or PA 32, and a supply control block 22 including the envelope tracker 30.

The transceiver 13 can generate an RF signal, and can provide the RF signal to a delay element 34. The delay element 34 can receive the RF signal and can delay the RF signal to compensate for a delay in generating a supply voltage for the power amplifier 32. The power amplifier 32 can amplify the delayed RF signal and provide the amplified signal to an input of the RF front end 12, which can include a duplexer and/or one or more switches, as was described earlier. The RF front end 12 can have an output electrically connected to the antenna 14. Although not illustrated in this figure, persons of ordinary skill in the art will appreciate that more or fewer power amplifiers can be electrically connected to the antenna 14 through the RF front end 12 to aid in providing a desired number of transmit and/or receive paths.

The transceiver 13 can provide the envelope of the RF signal to the supply control block 22. The supply control block 22 can include an envelope tracker 30 configured to receive a voltage from the battery 21. The envelope tracker 30 can generate a power amplifier supply voltage for the power amplifier 32. Additionally, the envelope tracker 30 can control the voltage level of the power amplifier supply voltage to change in relation to the envelope of the RF signal.

Although the transceiver 13 is illustrated as providing the envelope to the envelope tracker 30, the envelope of the signal can be generated in any suitable manner. For example, an envelope detector 31 can be included to generate an envelope signal from the RF signal. The envelope tracking capability can be used with either single amplifier stages or, as discussed below in connection with FIGS. 4, 5A and 5B, in connection with multi-stage amplifiers. As shown in FIG. 3, the supply control block 22 can be configured to control power amplifiers 32a, 32b. As will be discussed below, either both amplifiers in the dual amplifier stage can be controlled or, in some implementations, the second or final amplifier can be controlled.

Figure 4:
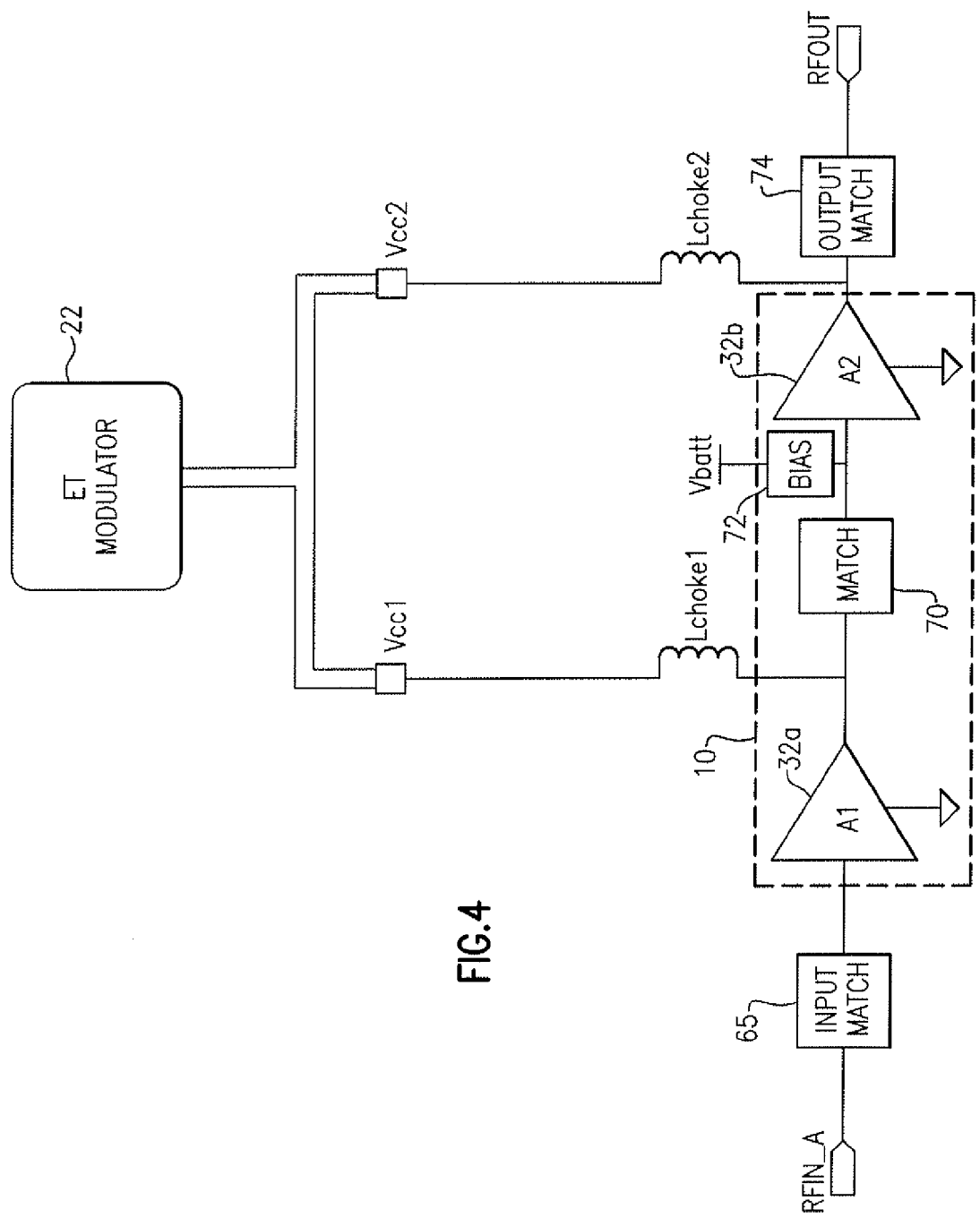
FIG. 4 is a schematic block diagram of a multi-stage amplifier component that has an envelope tracking capability.

FIG. 4 is an example of a multi-stage amplifier component that has an envelope tracking capability. It is understood that a conventional RF amplifier is designed with a fixed voltage operates most efficiently when the amplifier is in compression. If the communications device is using a modulation scheme based on the phase of frequency modulation, the amplifier can be driven into compression to provide higher levels of efficiency and less battery usage. However, many existing modulation schemes do use amplitude information and driving the amplifier into compression may result in lost data as the amplitude may be distorted.

To address this problem, envelope tracking circuits track the envelope of the incoming signal and then provide a supply voltage to the amplifier based upon the envelope of the incoming signal. FIG. 4 is one exemplary envelop tracking configuration, however, it will be appreciated that envelope tracking can occur in a variety of different manners and applications.

FIG. 4 shows an exemplary circuit diagram of a power amplifier module 10 that has an envelope tracking modulator 22 so that power is supplied to the amplifiers 32a, 32b of the amplifier module 10 in a manner that improves the efficiency of the power amplifier module. In this implementation, the envelope tracking modulator 22 provides a varying power signal to the amplifiers 32a, 32b via inductors Lchoke1 and Lchoke2. The inductors Lchoke1 and Lchoke2 aid in the powering the amplifiers 32a, 32b with the power voltages Vcc1 and Vcc2 from the envelope-tracking modulator 22 while blocking high frequency RF signal components.

As shown in FIG. 4, the input signal RFIN A is provided to the first stage amplifier 32 via an interstage match circuit 65 that is selected to match the input impedance of input RFIN A. The input signal RFIN A can comprise an RF signal received by the antenna 14 or being transmitted by the antenna 14 in the above-described manner. The output of the first stage amplifier 32a is then provided to the input of the amplifier 32b via an input match 70. The output of the amplifier 32a is biased via voltage from the battery 21 (FIG. 2) and a bias circuit 72. The output of the second amplifier 32b is then provided to an output as RFOUT via an output match 74 that is selected to match the impedance on the output side of the amplifier module 10. In one implementation, the signal RFOUT is provided to the switches 12 (FIG. 2) and then routed via the switches to the antenna 14 or the transceiver 13 in the previously described manner.

One issue that occurs as a result of the configuration of the power amplifier module 10 of FIG. 4 is that the power consumption is relatively high. This is the result of power being provided to both amplifiers 32a and 32b via the envelope tracking module 22 and power is also being provided to bias the input signal to the second amplifier 32b via the battery 21.

A further issue that occurs with the circuit of FIG. 4 is that there is a source of potential instability through the inductors Lchoke1 and Lchoke2. More specifically, if a feedback loop is established between the inductors Lchoke1 and Lchoke2, then the stability of the performance of the second amplifier 32b can be compromised leading to a degradation of circuit performance of the module 10. Loop stability is largely a function of the low frequency impedance of the ET modulator 22, the common Vcc1/Vcc2 inductance between the power amplifiers and the ET modulator 22 and resonances form other devices on the ET modulator 22 which can vary drastically from board to board based on the ET modulator 22 design and the physical location of the power amplifier and the ET modulator 22.

Figure 5A:
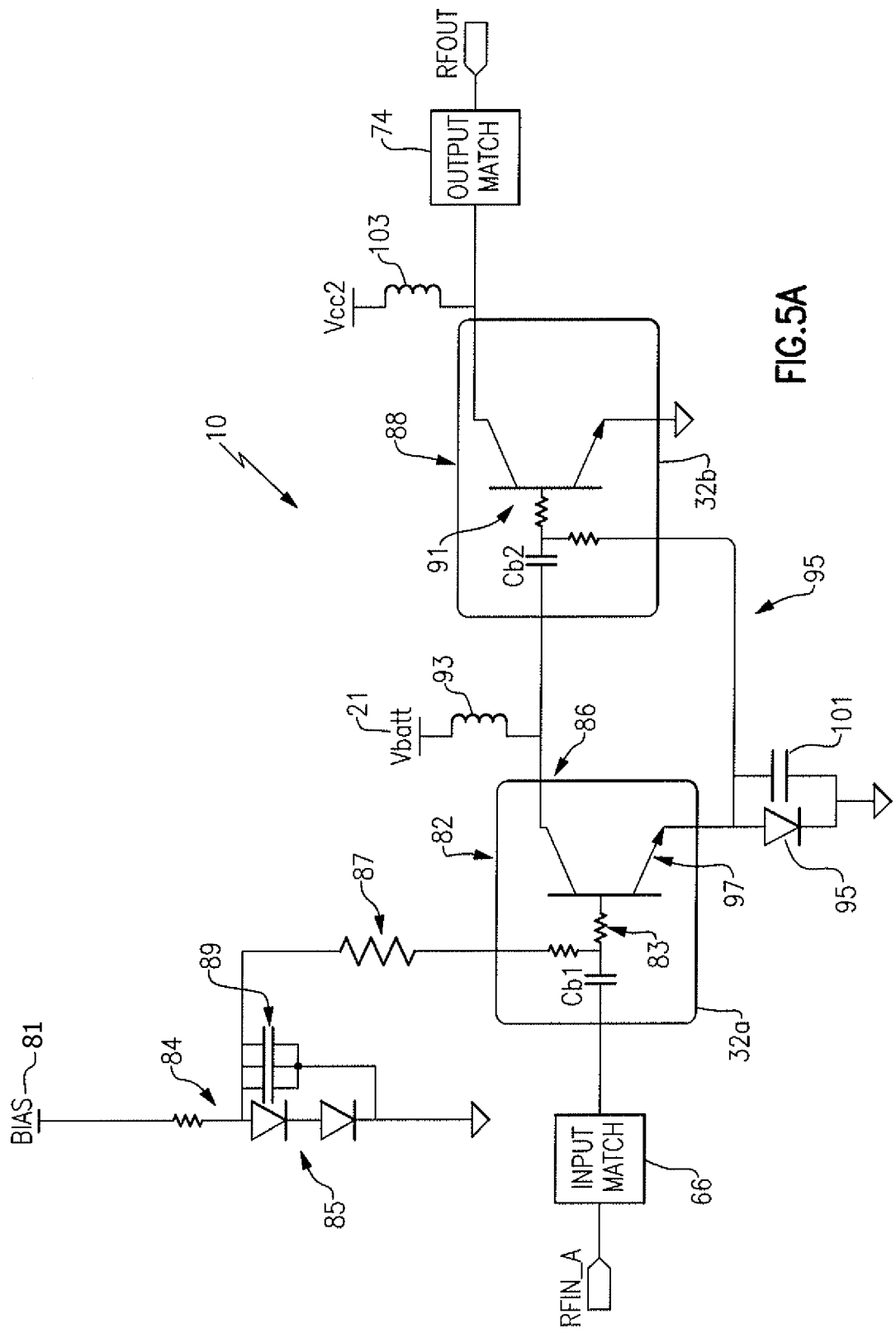
FIG. 5A and 5B are schematic block diagrams of a multi-stage amplifier circuit that can be incorporated into the wireless device of FIGS. 2.
Figure 5B:
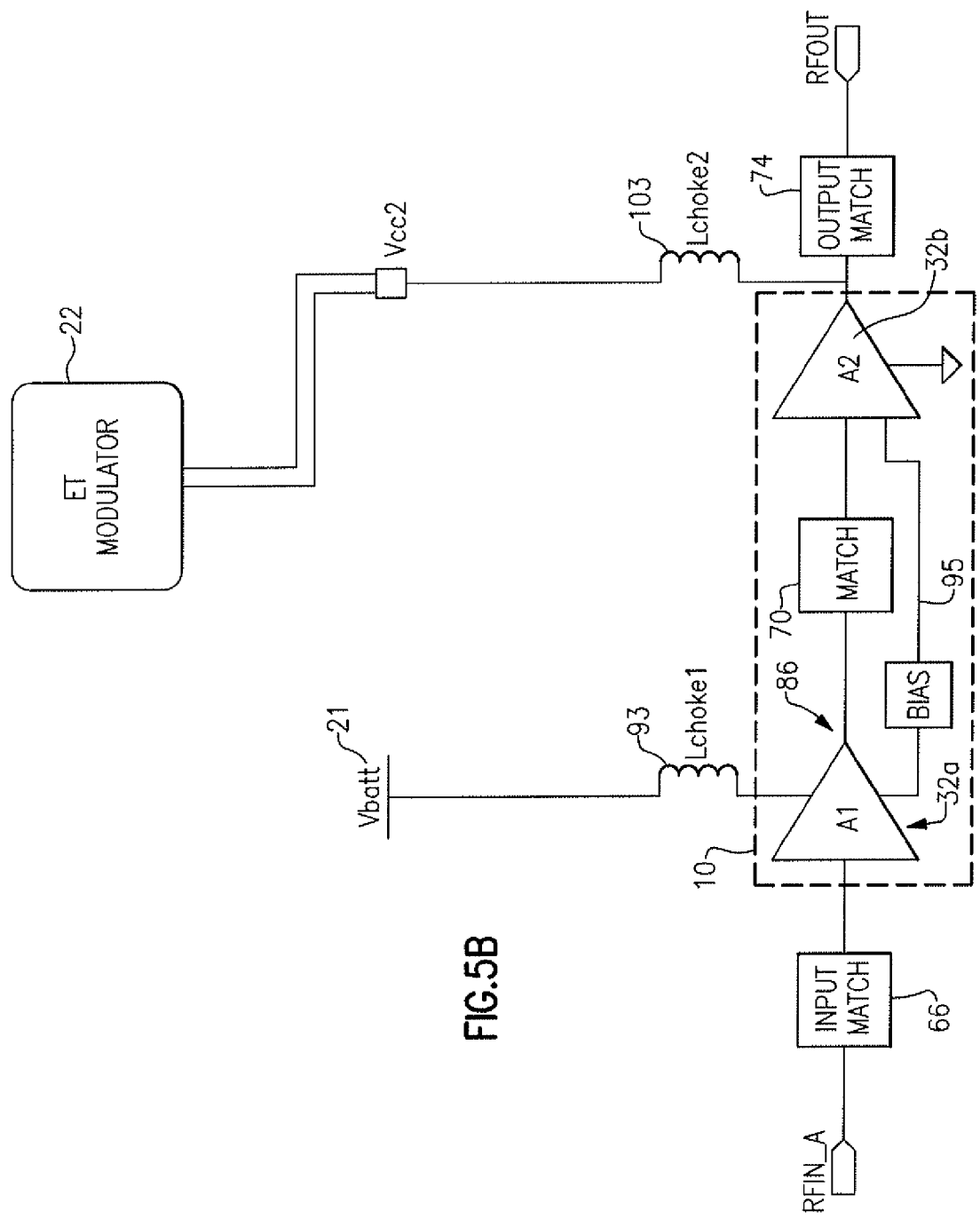

FIGS. 5A and 5B are schematics of different embodiments of a dual-stage amplifier module 10 that address the above-identified power consumption and stability issues. In this implementation, the dual-stage amplifier includes a first stage or driver amplifier 32a and a second stage or final amplifier 32b. The first stage or driver stage amplifier 32a comprises a transistor 82 that receives the input signal RFIN A via an input match 66. The input signal may be biased via a bias voltage 81 and a bias network 84 applied to the base 83 of the transistor 82. The bias voltage 81 and bias network 84 are selected so as to improve the efficiency of the dual-stage amplifier module 10. In this implementation, the bias network 84 includes diodes 85 that provide a path to ground and a resistor 87 that provide the bias to the base of the transistor 82a. The bias network 84 also includes capacitors 89 that are in parallel with the diodes 85 so as to provide a high frequency path to ground.

The output on the collector 86 of the transistor 82 that comprises the first stage amplifier 32a is provided to the input of the second stage amplifier 32b or, in the embodiment of FIG. 5A, to the base of the second stage amplifier transistor 88 via the match circuit 70 (FIG. 5B). Also, the bias current that is provided to the base 91 of the final stage is also provided by the emitter 97 of the driver stage amplifier transistor 82.

More specifically, the bias voltage is provided from the battery 21 to the base 91 of the final stage amplifier transistor 88 via the two diode circuit 85. An interconnect 95 is provided between the base 91 of the final stage transistor 88 and the emitter 97 of the driver stage transistor 82. The emitter 97 is tied to ground via a diode 99 that provides a path to ground and a parallel capacitor 101 that provides an AC ground. Thus, the DC current needed to operate the driver stage transistor 82 flows through the interconnect 95. The bias voltage for the final stage transistor 88 is provided by the emitter 86 of the driver stage transistor 82. At the DC level, the driver stage 82 looks like an emitter follower driving the base 91 of the final stage 88. The collector current of the final stage 88 increases with the RF input power. This causes the final stage base current to increase by the relationship Ib=Ic/Beta. The base current on the final stage 88 is effectively reused via the interconnect 95 by the driver stage transistor 82 such that the driver stage 82 can provide adequate power to the final stage transistor 88 without adding extra current drain to the battery 21 or at least by reducing the extra current drain to the battery 21.

This results in a discernable increase in the efficiency of the dual stage power amplifier module 10 disclosed herein. This increase in efficiency can be illustrated by the following example comparing the circuits of FIGS. 4 and 5A. Assuming for the operation of both the modules 10 of FIGS. 4 and 5A that the output power Pout is 30 dBM and that the RF gain is 30 dB, the collector current of the final stage amplifier 32b is 500 mA and the collector current of the driver stage amplifier 32a is 30 mA and the bias current of the final stage amplifier 32b is also 30 mA and the supply voltage is 3V, with these assumptions, the Power Added Efficiency (PAE) for the power amplifier module 10 of FIG. 3 can be determined as follows:

$$Pout=30 \text{ dBm}=1 \text{ Watt}$$

$$Pin=30 \text{ dBM}-30 \text{ dB}=30 \text{ dBm}=1 \text{ mWatt}$$

$$Pdc=3V\times(500 \text{ ma}+30 \text{ mA}+30 \text{ mA})=1.68 \text{ Watts}$$

$$PAE=(Pout-Pin)/Pdc=1 \text{ W}-1 \text{ mW}/1.68 \text{ W}=59.5\%$$

Similarly, with these assumptions the Power Added Efficiency (PAE) for the power amplifier module 10 of FIG. 4 can be determined as follows:

$$Pout=30 \text{ dBm}=1 \text{ Watt}$$

$$Pin=30 \text{ dBM}-30 \text{ dB}=30 \text{ dBm}=1 \text{ mWatt}$$

$$Pdc=3V\times(500 \text{ ma}+30 \text{ mA})=1.59 \text{ Watts}$$

$$PAE=(Pout-Pin)/Pdc=1 \text{ W}-1 \text{ mW}/1.59 \text{ W}=59.5\%$$

Since the 30 mA that is being applied to the bias the base of the final stage amplifier 32b is also being provided to the collector of the driver amplifier 32a, the overall current that is flowing through the first stage or driver amplifier 32a can be reduced which provides for a 3% or greater efficiency savings thereby prolonging battery life.

FIG. 5A can either have both the first stage amplifier 32a and the second stage amplifier 32b biased by the envelope tracking modulator 22 in the previously described manner or just the final stage amplifier 32b can receive power via the envelope tracking module. If both the first stage amplifier 32a and the second or final stage amplifier 32b are powered by the envelope tracking module 22, then the potential of instability exists as discussed above. However, as is also shown in FIG. 5A and 5B, the first stage amplifier 32b can have a fixed bias from the battery 21 which reduces the efficiency of the first stage driver amplifier 32a but provides greater stability.

However, if the second stage final output amplifier 32b is connected to the envelope tracking module 22 in the manner shown in FIG. 5B, then the final stage amplifier 32b operates at a higher level of efficiency. In many typical multi-stage RF amplifier circuits, the collector current of the later stages are considerably higher than the collector currents of the driver amplifiers as is exemplified by the Example given above. As such, there may be some lost efficiency by having the driver amplifier 32a fixed biased. However, in some implementations, this lost efficiency may be made up for by the re-use of the bias current on the final stage amplifier 32b to source the collector current of the driver stage amplifier 32a.

FIG. 5B illustrates this interconnection is greater detail. As shown, in FIG. 5B, the envelope tracking modulator 22 is only connected to the output of the final stage amplifier 32b. In this way, the driver or first stage amplifier 32a is biased using fixed biasing from the battery voltage Vbatt. The final stage amplifier 32b in this embodiment operates at current levels that are considerably higher than the current levels of the driver stage amplifier 32a. As such, the final stage amplifier 32b can be operated at higher levels of efficiency with the driver stage amplifier 32a operating lower levels, but since most of the power is being consumed by the final stage amplifier 32b, the overall efficiency of the dual amplifier module 10 can, in some implementations, be relatively unaffected. Moreover, since the driver stage amplifier 32a and the inductor associated isolation inductor 93 is disconnected from the envelope tracking modulator 22, the potential of resonance between the driver stage amplifier 32a and the inductor 93 and the final stage amplifier 32b and the inductor L 103 is reduced thereby providing greater stability of the circuit.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "can," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While certain embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A power amplifier module for an radio frequency communications circuit, the module comprising:
    a driver stage amplifier having an input that receives an radio frequency signal, the driver stage amplifier powered by a supply voltage which is applied across first and second nodes of the driver stage amplifier to amplify the radio frequency signal;
    a final stage amplifier that receives an amplified radio frequency signal from an output of the driver stage amplifier on the first node, that is powered by a supply voltage applied across the final stage amplifier, and that provides an amplified output signal, a bias current applied to the input of the final stage amplifier and applied to the second node to power the driver stage amplifier to reduce the current that flows through the driver stage amplifier; and
    an envelope tracking module that provides power to at least one of the driver stage amplifier and final stage amplifier.

2. The module of claim 1 wherein the envelope tracking module provides power to the final stage amplifier.

3. The module of claim 2 wherein the driver stage amplifier is powered from a fixed power source.

4. The module of claim 3 wherein the fixed power source includes a battery.

5. The module of claim 2 wherein the envelope tracking module provides power to both the driver stage amplifier and the final stage amplifier.

6. The module of claim 1 wherein the driver stage amplifier includes a first transistor, the final stage amplifier includes a second transistor, a base of the first transistor forms the input of the driver stage amplifier, a collector of the first transistor forms the output of the driver stage amplifier and is connected to a base of the second transistor which forms the input of the final stage amplifier, and a collector of the second transistor forms the output of the final stage amplifier.

7. The module of claim 6 wherein the base of the second transistor is biased by a current and is electrically connected to an emitter of the driver stage amplifier.

8. The module of claim 1 wherein re-using the base current biasing of the final stage amplifier to power the input stage amplifier results in at an approximate efficiency improvement of 3% power added efficiency.

9. An radio frequency communications device comprising:

an radio frequency input and an radio frequency output;

a dual stage power module having first and second amplifiers, the input of the first amplifier receiving an radio frequency signal from the radio frequency input, the first amplifier having a first and second node, the output of the first amplifier at the first node provided to the input of the second amplifier which also receives a bias signal, and the output of the second amplifier provided to the radio frequency output;

a power supply that provides power to both the first and second amplifiers, at least one of the first and second amplifiers provided power based on envelope tracking of the signal; and an interconnect that interconnects the input of the second amplifier to the power supply at the second node of the first amplifier so that the bias signal is provided to the power supply of the first amplifier to provide power to the first amplifier.

10. The device of claim 9 wherein the envelope tracking module provides power to the second amplifier.

11. The device of claim 10 wherein the first amplifier is powered from a fixed power source.

12. The device of claim 11 wherein the fixed power source includes a battery.

13. The device of claim 10 wherein the envelope tracking module provides power to both the first amplifier and the second amplifier.

14. The device of claim 9 wherein the first amplifier includes a first transistor, the second amplifier includes a second transistor, a base of the first transistor forms the input of the first amplifier, a collector of the first transistor forms the output of the first amplifier and is connected to a base of the second amplifier which forms the input of the second amplifier, and a collector of the second transistor forms the output of the second amplifier.

15. The device of claim 14 wherein the base of the second transistor is biased by a current and is electrically connected to an emitter of the first amplifier.

16. The device of claim 9 further comprising a switching network that switches between a transmit and a receive mode.

17. The device of claim 16 further comprising a processor and computer readable medium that controls the envelope tracking module and the switching network.

18. A method of amplifying radio frequency signals, the method comprising:

amplifying a first signal in a first amplifier having a first and second node;

providing the output of the first amplifier at the first node to a second amplifier;

providing power to the first and second amplifiers;

biasing the input of the second amplifier with a biasing signal; and providing at least a portion of the biasing signal applied to the second amplifier to the first amplifier at the second node to power the first amplifier.

19. The method of claim 18 wherein powering the first and second amplifiers includes detecting the envelop of the first signal and providing variable power to at least one of the first and second amplifiers based at least in part on the envelope of the first signal.

20. The method of claim 19 wherein providing variable power to at least one of the first and second amplifiers includes providing variable power the second amplifier and providing fixed power to the first amplifier.

* * * * *